(12) United States Patent
Cho

(10) Patent No.: US 7,800,143 B2
(45) Date of Patent: Sep. 21, 2010

(54) DYNAMIC RANDOM ACCESS MEMORY WITH AN AMPLIFIED CAPACITOR

(75) Inventor: Hyun-Jin Cho, Palo Alto, CA (US)

(73) Assignee: GlobalFoundries Inc., Grand Cayman (KY)

( * ) Notice: Subject to any disclaimer, the term of this patent is extended or adjusted under 35 U.S.C. 154(b) by 393 days.

(21) Appl. No.: 11/615,982

(22) Filed: Dec. 24, 2006

(65) Prior Publication Data

US 2008/0012051 A1 Jan. 17, 2008

Related U.S. Application Data

(60) Provisional application No. 60/830,571, filed on Jul. 13, 2006.

(51) Int. Cl.
| H01L 29/76 | (2006.01) |
| H01L 29/94 | (2006.01) |
| H01L 21/331 | (2006.01) |
| H01L 21/8222 | (2006.01) |
| H01L 27/082 | (2006.01) |

(52) U.S. Cl. ............... 257/273; 257/370; 257/517; 257/565; 438/309; 438/313; 438/340

(58) Field of Classification Search ............ 257/273, 257/592, 586, 368, 369, 370, 565, 566, 574, 257/575, 577, 378, 517; 438/205, 313, 340, 438/203, 204, 335, 328–330, 309, 202, 234
See application file for complete search history.

(56) References Cited

U.S. PATENT DOCUMENTS

| 4,199,774 | A | | 4/1980 | Plummer | 357/41 |
| 5,119,337 | A | * | 6/1992 | Shimizu et al. | 365/201 |
| 5,345,103 | A | | 9/1994 | Aoki | 257/589 |
| 5,872,032 | A | * | 2/1999 | Chi | 438/238 |
| 5,909,400 | A | * | 6/1999 | Bertin et al. | 365/187 |
| 5,998,820 | A | | 12/1999 | Chi | 257/296 |
| 6,376,880 | B1 | | 4/2002 | Holst | 257/347 |
| 6,492,211 | B1 | | 12/2002 | Divakaruni et al. | 438/155 |
| 6,768,667 | B2 | | 7/2004 | Hoffmann et al. | 365/149 |
| 6,791,107 | B2 | | 9/2004 | Gill et al. | 257/20 |
| 6,838,723 | B2 | | 1/2005 | Forbes | |
| 6,873,018 | B2 | | 3/2005 | Bhattacharyya | 257/378 |
| 6,914,255 | B2 | | 7/2005 | Lowrey | 257/5 |
| 6,943,083 | B2 | | 9/2005 | Forbes | |
| 6,972,466 | B1 | * | 12/2005 | Liang et al. | 257/370 |
| 6,989,580 | B2 | | 1/2006 | Pellizzer et al. | 257/577 |
| 7,030,436 | B2 | | 4/2006 | Forbes | 257/196 |

(Continued)

OTHER PUBLICATIONS

USPTO Office Action Notification Date Aug. 12, 2009; U.S. Appl. No. 11/615,983.

*Primary Examiner*—Chuong A. Luu
(74) *Attorney, Agent, or Firm*—Ditthavong, Mori & Steiner, P.C.

(57) ABSTRACT

A memory cell and methods of making and operating the same are provided. In one aspect, a method of forming a memory cell is provided that includes forming a MOS transistor that has a gate, a source region and a drain region. A bipolar transistor is formed that has a collector, a base and an emitter. The emitter of the bipolar transistor is formed to serve as the source region for the MOS transistor and the base of the bipolar transistor is formed to serve as a capacitive charge storage region for the memory cell.

17 Claims, 9 Drawing Sheets

U.S. PATENT DOCUMENTS

| | | |
|---|---|---|
| 7,466,584 B1 | 12/2008 | Parkinson et al. |
| 7,515,455 B2 | 4/2009 | Nirshl et al. |
| 7,532,507 B2 | 5/2009 | Hayakawa |
| 2004/0155298 A1 | 8/2004 | Bhattacharyya ............. 257/378 |
| 2004/0155299 A1 | 8/2004 | Bhattacharyya ............. 257/378 |
| 2009/0003044 A1 | 1/2009 | Happ et al. |

* cited by examiner

DYNAMIC RANDOM ACCESS MEMORY WITH AN AMPLIFIED CAPACITOR

This application claims benefit under 35 U.S.C. 119(e) of prior provisional application Ser. No. 60/830,571, filed Jul. 13, 2006.

BACKGROUND OF THE INVENTION

1. Field of the Invention

This invention relates to the semiconductor memory devices, and more specifically to semiconductor memory devices that are easy to fabricate while compatible with conventional dynamic random access memories (DRAMS).

2. Description of the Related Art

A conventional DRAM cell 100 is illustrated schematically in FIG. 1. It consists of one access transistor 102 and one storage capacitor 104. A gate 106 of the transistor 102 controls the switching of the transistor 102, which allows or prohibits the movement of charges between the capacitor 104 and a bit line 108. While one plate of the capacitor 104 is coupled to the access transistor 102, the other plate is coupled to a common line 109. The data stored in cell 100 (i.e., digital data "0" or "1") is determined by sensing the amount of charges stored in capacitor 104.

In order to provide enough signal margins for sensing, it is necessary to have a large capacitor with a large capacitance. On the other hand, it is desirable to reduce the size of a cell. As a result, exotic capacitor structures (e.g., trench and stack) that have large surface areas have been developed. These structures are fabricated using complicated processes, which increase costs and reduce yield.

Many people have realized the problem and attempted to build DRAM cells without using complicated capacitor fabrication processes. One example is the so-called "floating body cell" (FBC), shown as a cell 130 in cross-section in FIG. 2. The cell 130 consists of a transistor that has a gate 132 and a gate oxide film on top of a body 134. Two impurity regions 136 and 138 straddle the body 134. The transistor is fabricated on top of an insulator 140, which is disposed on top of a substrate 142. Instead of storing charges in a capacitor as in capacitor-based DRAM cells, this device stores charges in the body 134 of the transistor. The charges can reduce the threshold voltage of the transistor, thereby increasing current flow in a read operation. By sensing the transistor current level, the amount of charge in the body 134 can be determined. A variation of the FBC is the so-called twin-transistor random access memory. This device has two transistors: one for switching and the other for storing a charge. This two-transistor arrangement provides more reliable cell operation because the switching transistor prevents a disturbing event from affecting the bit line.

Although these types of cells are easier to fabricate than conventional DRAM cells, there are many problems. First, the difference in current between data "1" state and data "0" state is very small, and it is difficult to read the difference. Second, the control signals are very complicated: many different voltage levels with complex timing requirements are needed for read and write operations. Also, current sensing is used instead of voltage sensing in conventional DRAM. Current sensing is not compatible with conventional DRAM circuitry. Third, data disturbance is a very serious problem, especially for a single transistor type cell arrangement. Data disturbance is typically the result of leakage currents transiting the junctions of, for example, the impurity regions 136 and 138 depicted in FIG. 2. These leakage currents can inadvertently change the logic state sensed during a read operation, resulting in erroneous data.

The present invention is directed to overcoming or reducing the effects of one or more of the foregoing disadvantages.

SUMMARY OF THE INVENTION

The present invention comprises an amplifier that can increase the capacitance of a capacitor. As a result, the size of the capacitor in a memory cell can be small. In one embodiment, the amplifier is a bipolar junction transistor and charges are stored in the base region of the transistor. The memory cell also comprises an access transistor. By properly biasing the memory cell, charges stored in the base region are amplified by bipolar action, resulting in increased cell capacitance. Some of the advantages of this cell are simple fabrication procedure and compatibility with conventional DRAM architecture.

In accordance with one aspect of the present invention, a method of forming a memory cell is provided that includes forming a MOS transistor that has a gate, a source region and a drain region. A bipolar transistor is formed that has a collector, a base and an emitter. The emitter of the bipolar transistor is formed to serve as the source region for the MOS transistor and the base of the bipolar transistor is formed to serve as a capacitive charge storage region for the memory cell.

In accordance with another aspect of the present invention, a method of operating a memory cell is provided that includes providing a memory cell that includes a MOS transistor that has a gate, a source region and a drain region. The memory cell is also provided with a bipolar transistor that has a collector, a base and an emitter. The emitter of the bipolar transistor serves as the source region for the MOS transistor and the base of the bipolar transistor serves as a capacitive charge storage region for the memory cell. A capacitor gate is provided proximate the base region of the bipolar transistor. A level of charge stored in the base region is manipulated.

In accordance with another aspect of the present invention, a memory cell is provided that includes a MOS transistor that has a gate, a source region and a drain region. The memory cell also includes a bipolar transistor that has a collector, a base and an emitter. The emitter of the bipolar transistor serves as the source region for the MOS transistor and the base of the bipolar transistor serves as a capacitive charge storage region for the memory cell.

In accordance with another aspect of the present invention, a memory array is provided that includes a plurality of memory cells. Each of the memory cells includes a MOS transistor that has a gate, a source region and a drain region, and a bipolar transistor that has a collector, a base and an emitter. The emitter of the bipolar transistor serves as the source region for the MOS transistor and the base of the bipolar transistor serves as a capacitive charge storage region for the memory cell. A word line is coupled to the gate of each MOS transistor and a bit line is coupled to the drain region of each MOS transistor.

In accordance with another aspect of the present invention, a memory cell is provided that includes a switching device and a charge storage device electrically coupled to the switching device. The charge storage device includes an amplification device that has a body that also serves as a capacitive storage device. A word line is electrically coupled to the switching device and a bit line is electrically coupled to the switching device.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

The following description is presented to enable any person skilled in the art to make and use the invention. Descriptions of specific applications are provided only as examples. Various modifications to the disclosed embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
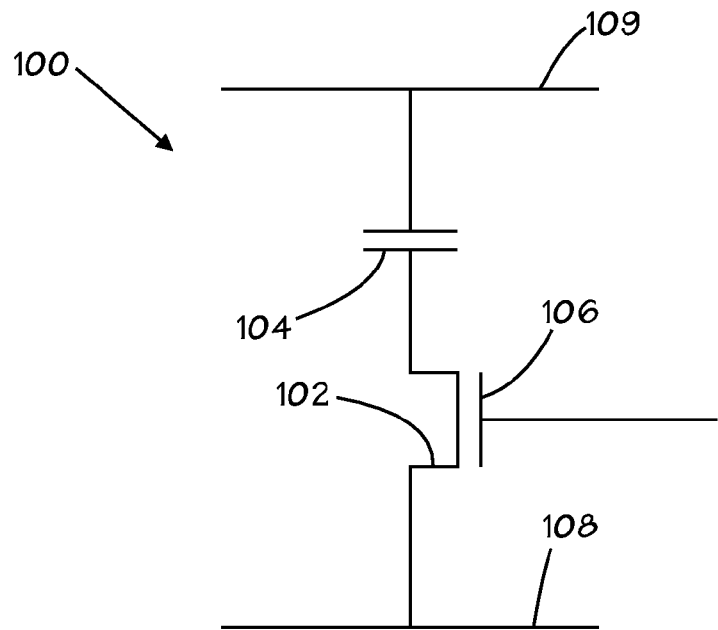
FIG. 1 is a schematic view of a conventional DRAM cell.
Figure 2:
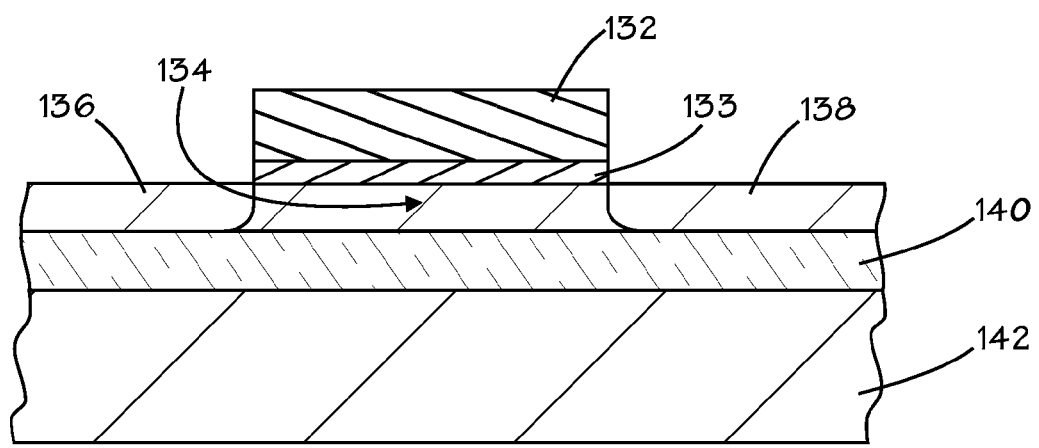
FIG. 2 is a sectional view of a conventional floating body cell.
Figure 3:
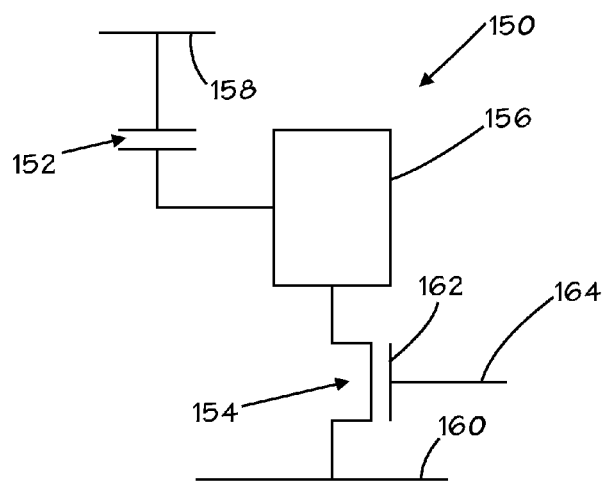
FIG. 3 is a schematic view of an exemplary embodiment of a memory cell in accordance with the present invention.

An exemplary embodiment of a memory cell 150 is presented in schematic form in FIG. 3. The cell 150 includes a capacitor 152, an access transistor 154, and an amplifier 156. The amplifier 156 amplifies the charge stored in the capacitor 152. One plate of the capacitor 152 is coupled to the amplifier 156 and the other plate is coupled to a common line 158. The amplified charge is delivered to a bit line 160 through the access transistor 154. The access transistor 154 includes a gate 162. The switching action of the transistor 154 is controlled by the gate 162. The gate 162 may be connected to a word line 164. As a result of the amplifier 156, the size of capacitor 152 can be smaller than that of a conventional DRAM. The combination of the amplifier 156 and the capacitor 152 is described herein as a "virtual capacitor."

Figure 4:
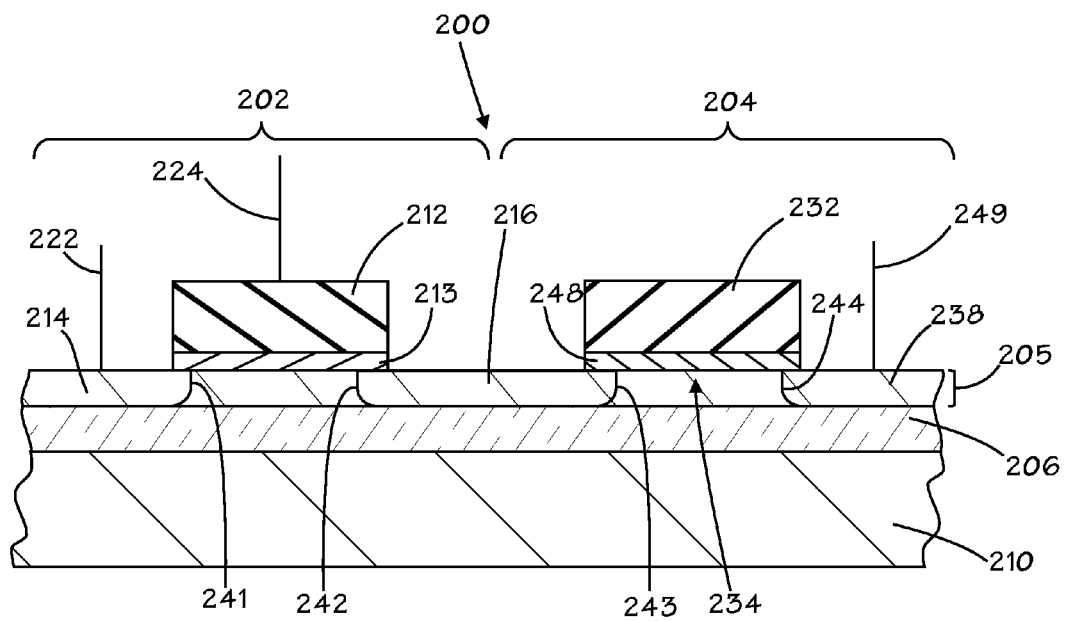
FIG. 4 is a sectional view of an exemplary embodiment of a memory cell in accordance with the present invention.

A sectional view of an exemplary embodiment of a memory cell 200 is shown in FIG. 4. The memory cell 200 includes an access transistor 202 adjacent to a virtual capacitor 204. These components are disposed on and/or in a semiconductor layer 205 that is positioned on top of an insulation layer 206 using standard silicon-on-insulator technology. A supporting substrate 210 is positioned beneath the insulation layer 206. In this embodiment, the access transistor 202 is a metal oxide silicon field effect transistor (MOSFET). The MOSFET 202 can be implemented either as NMOS or PMOS. The virtual capacitor 204 can be built using conventional metal oxide silicon (MOS) capacitor and bipolar device technology. As a result, standard fabrication processes can be used.

The access transistor 202 is a conventional three-terminal MOSFET that has a gate 212, a gate dielectric layer or film 213, a drain region 214, and a source region 216. The drain region 214 is connected to a bit line 222 and the gate 212 is connected to a word line 224. Note that the bit line 222 and the word line 224 are schematically represented. The source region 216 is shared with the virtual capacitor 204. The skilled artisan will appreciate that the structure identified as the drain region 214 and the structure identified as the drain region 216 can be operationally interchangeable, that is, the drain region 214 can function as a source and the source region 216 can function as a drain, depending on how those regions are biased electrically. Thus, references to "source" or "drain" herein should be understood to refer to an impurity region that could function as either.

The amplifier in the virtual capacitor 204 is a bipolar junction transistor (BJT) that includes impurity regions 234 and 238 and the shared impurity region or source 216. The impurity region 234 serves as the base, the impurity region 238 serves as the collector and the shared source 216 serves as the emitter of the BJT. At the same time, the base region 234 is also the charge storage region of the virtual capacitor 204. In the memory cell 200, the various impurity regions of the access transistor 202 and the virtual capacitor 204 form four semiconductor junctions 241, 242, 243 and 244 in the semiconductor layer 205. Note that where the transistor is implemented as a NMOS device, the base impurity region 234 will be a p-type impurity region and the junction 243 will be an np junction.

The charging mechanism of the virtual capacitor 204 is different from that of conventional capacitors because the capacitor 204 is built upon a bipolar device. A capacitor gate 232 along with an interposed gate dielectric layer 248 are positioned over the body 234 provided to facilitate the charging. The memory cell 200 should be correctly biased as described in more detail below so that the charges stored in the base region 234 can be properly amplified. Preliminarily, it is noted that the collector 238 is coupled to a conductor 249.

Figure 5:
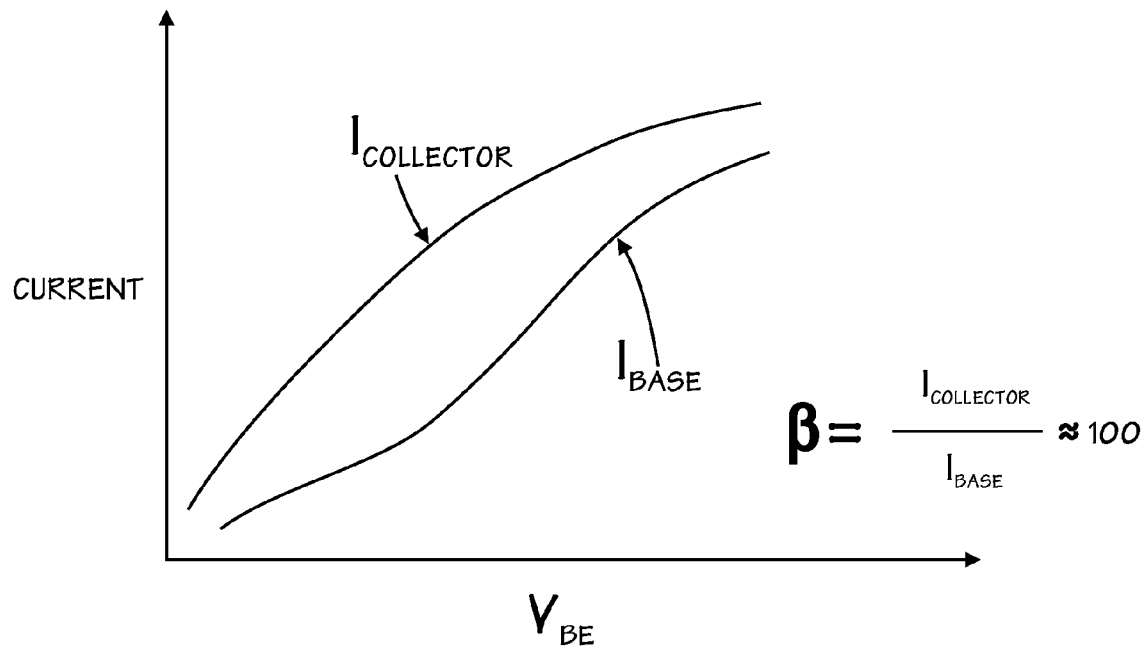
FIG. 5 is a plot of current versus voltage for an exemplary embodiment of an amplifier in accordance with the present invention.

A BJT is known for its current amplification at active bias mode. FIG. 5 shows the current-voltage characteristics of a bipolar transistor. When the base to collector voltage is reverse biased and the base to emitter voltage is forward biased, the current flowing in the base region is amplified by the bipolar action. For example, if the current gain β is 100, the current in the collector, $I_{collector}$, becomes 100 times the current in the base, $I_{base}$. This amplification action also takes place even when the base region is floating or the virtual capacitor is operated in open base bipolar operation mode.

When charges Q are stored in the base region and the bipolar is in the active mode, the charge flowing through the emitter junction is given by:

$$Q_{emitter} = Q_{base} \cdot (\beta+1) \quad \text{Equation 1}$$

Since the definition of capacitance is:

$$C = Q/V \quad \text{Equation 2}$$

the capacitance at the emitter junction becomes:

$$C_{emitter} = C_{base} \cdot (\beta+1) \quad \text{Equation 3}$$

This means that the capacitor formed at the base region 234 is amplified at the emitter junction 243. For example, if the base capacitance is 0.2 fF and the bipolar gain β is 100, the capacitance becomes 20 fF, which is large enough to be use as a DRAM cell. As a result, the virtual capacitor 204 of the present invention can be used to replace the complicated trench or stack capacitors in conventional DRAM cells.

Figure 6:
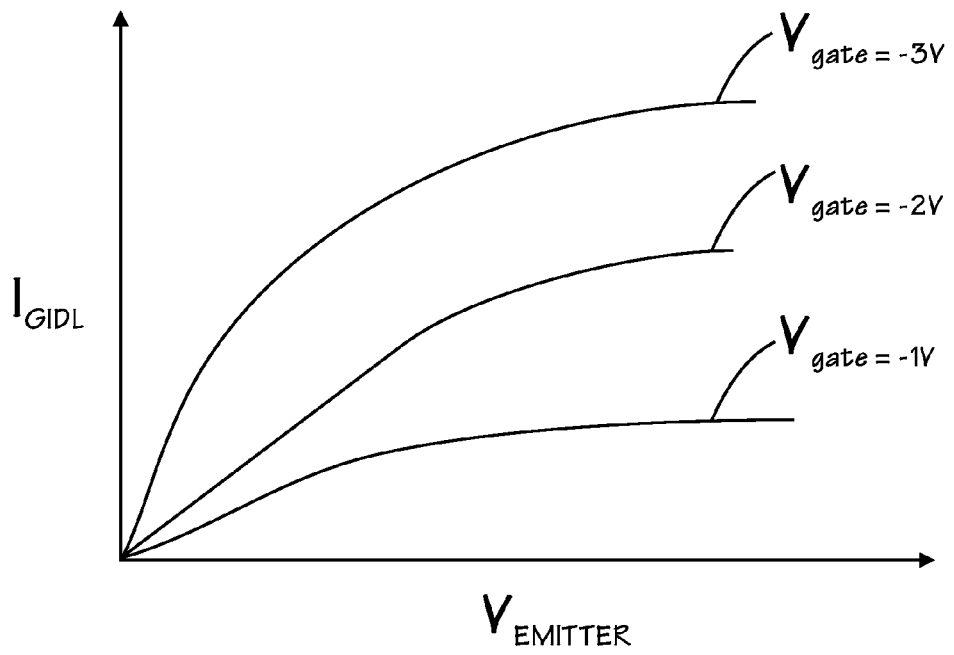
FIG. 6 is a plot of gate induced drain leakage current versus drain voltage for an embodiment of a memory cell in accordance with the present invention.

Because the virtual capacitor 204 is built upon a bipolar device, special charging mechanisms may be used. Two methods will now be described. In the first method, a constant collector voltage of preferably about 0.5V to 2V is applied to the collector region 238 by way of the conductor 248. The voltage at the capacitor gate 232 is set at a negative bias voltage of say, between about −0.5V and −3V. The access transistor 202 is turned from an OFF to an ON state by changing the voltage at the word line 224 from a low standby voltage of say, between about −1.5V to 0.0V to a high level of about 1.0V for charging. There is now a large voltage difference between the capacitor gate 232 and the emitter region 216. When the voltage difference is large enough, a gate induced drain leakage (GIDL) current is developed. In essence, current leaks across the np junction 243 and into the body 234. FIG. 6 shows the relationship between GIDL current and the voltage at the emitter region 216. When the gate to drain bias voltage is increased, sufficient electric field can develop to trigger the tunneling of electrons and holes from one conduction/valance band to another band. As a result, the GIDL current increases with increasing voltage difference between the capacitor gate 232 and the emitter region 216. The current level is well controlled by the bias condition between the gate 232 and the emitter 216. One advantage of this method is its simple bias scheme: a constant bias is applied to both the capacitor gate 232 and the collector region 238 during the entire cell operation.

In order to increase the GIDL current, the structure of the junction 243 should be optimized. For example, a strong overlap between the junction 243 and the capacitor gate 232 can increase the GIDL current. Similarly, increasing the doping concentration of the junction 243 can also improve the GIDL current.

Figure 7:
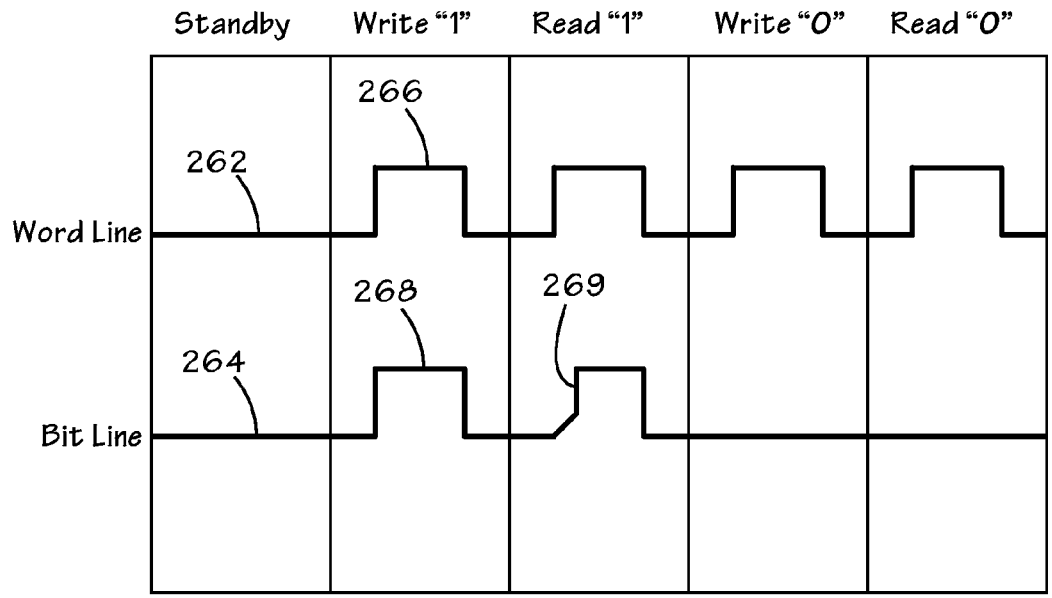
FIG. 7 is a timing diagram of one mode of operation of the exemplary embodiment of a memory cell in accordance with the present invention.

Attention is now turned to FIG. 7, which is a timing diagram of the operation of the memory cell 200 (see FIG. 4) under the first method of charging. At standby, the word line (see element 224 in FIG. 4) is at a low voltage 262 and the bit line (see element 222 in FIG. 4) is at a low voltage 264 (e.g., approximately ground). For both read and write operations, the access transistor 202 is turned on by changing the word line to a high voltage 266. For writing a data "1" state into the memory cell 200, the voltage at the bit line is increased to a high voltage 268. For writing a data "0" into the memory cell 200, the bit line remains at low voltage 264. During reading, if the bit line remains at low voltage 264, the stored data is a "0" or zero state. If the voltage at the bit line increases (e.g., voltage profile 269), the stored data is a "1". As can be seen in FIG. 7, the timing requirement for the operation of the memory cell 200 is very simple.

The second charging method will now be described. Referring again to FIG. 4, the capacitor gate 232 is originally at standby between −0.5V to −3V. Thereafter, a positive pulse of about 0.5V to 2V is applied during charging. The collector region 238 is originally at a standby voltage of about 0.5V to 2V, and a pulse of 0.0V to −1.5V is applied. Similar to the first method, the access transistor 202 is turned from an OFF to an ON state by changing the voltage at the word line 224 from a low standby voltage of between about −1.5V to 0.0V to a high level of about 1.5V for charging. When the capacitor gate 232 is in positive bias and the emitter region 216 is also in positive bias, electrons flow from the emitter region 216 to the collector region 238. When the electrons receive sufficient energy, they create electron-hole pairs and inject holes into the body region 234. This mechanism is known as impact ionization. After sufficient charges are accumulated, usually in a few nanoseconds, e.g., 1 to 10 nanoseconds, of hole injection, the collector region 238 and the capacitor gate 232 return to their standby level. The advantage of this scheme is rapid charging of the base region 234 due to high impact ionization current. However this method requires multiple bias and timing control during write operation which makes the cell operation complicated.

Figure 8:
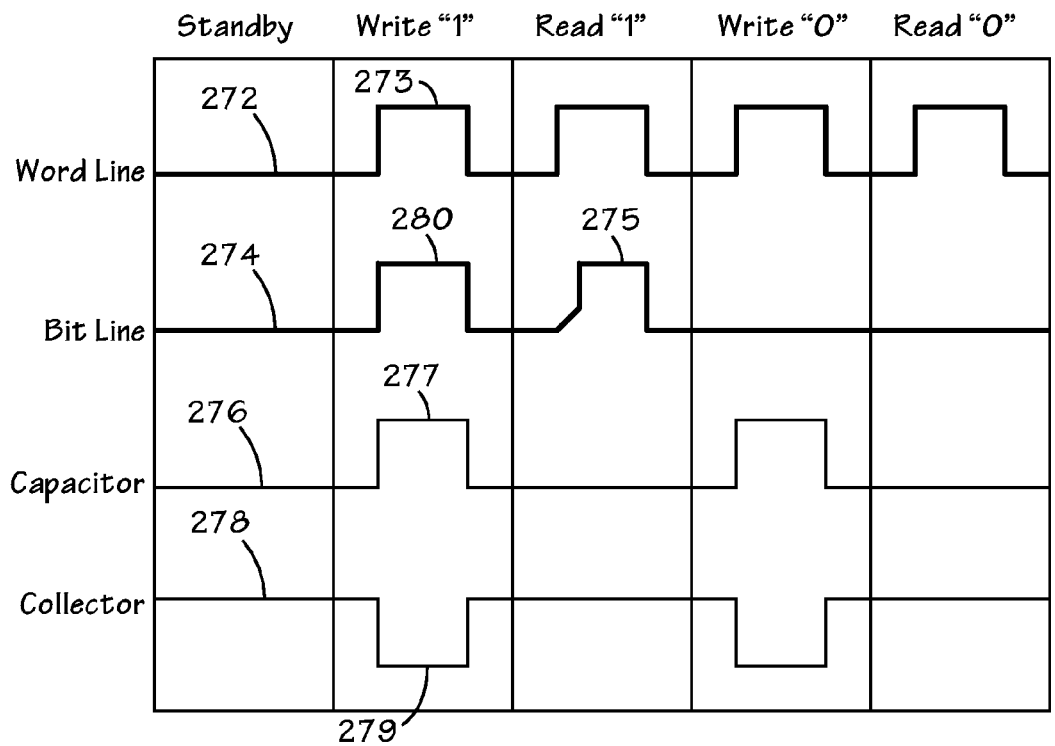
FIG. 8 is a timing diagram of another mode of operation of the exemplary embodiment of a memory cell in accordance with the present invention.

FIG. 8 is a timing diagram of the operation of the memory cell 200 under the second method of charging. Attention should also be directed again to FIG. 4. At standby, the word 224 line is at a low voltage 272 and the bit line 222 is at a low voltage 274. The capacitor gate 232 is at a low voltage 276 while the collector is at a high voltage 278. For both read and write operations, the access transistor 202 is turned on by changing the word line to a high voltage 273. During the read operation, both the capacitor gate 232 and the collector 238 stay at their standby voltages. The determination of the stored data is similar to that of the first method. If the bit line 222 remains at standby voltage, the stored data is a "0", and if the bit line 222 increases (e.g., to a high voltage 275), the stored data is a "1". For write operations (both "1" and "0"), the capacitor gate 232 is pulsed to a high voltage 277 and the collector 238 is pulsed to a low voltage 279. For writing a "1", the bit line 222 is raised to a high voltage 280. For writing a "0", the bit line 222 remains at the standby voltage.

Figure 9:
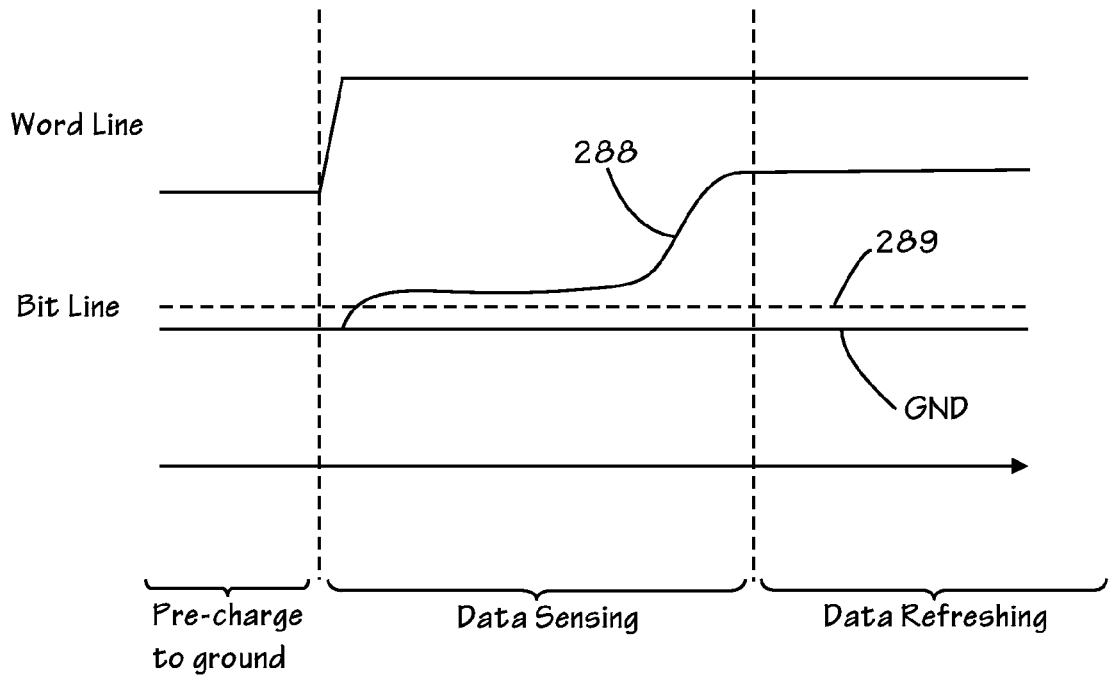
FIG. 9 is a timing diagram depicting a read operation of the exemplary embodiment of a memory cell in accordance with the present invention.

The sense operation of the memory cell 200 depicted in FIG. 4 is shown in FIG. 9. At the beginning of a read operation, the bit line is pre-charged to ground. Prior to raising the word line voltage, the bit line is switched to a floating state. The word line voltage is then increased to turn on the access transistor. The charge stored in the virtual capacitor is shared with the bit line. If the memory cell is in a data "1" state, the bipolar transistor action of the virtual capacitor amplifies the charge in its base region. The bit line voltage level rises up to Vdd as shown by the curve 288. If the cell is in data "0" state, there is no bipolar transistor action and the bit line voltage level stays in a ground level GND. In order to distinguish between data "0" and "1" states, a reference voltage level 289 is used. After the sensing process is completed, the bit line is forced immediately into a write mode: bit line is forced to ground after reading "0" and to a high level after reading "1". This process is known as data refreshing or refresh, or read and write back commonly used in DRAM operations.

Figure 10:
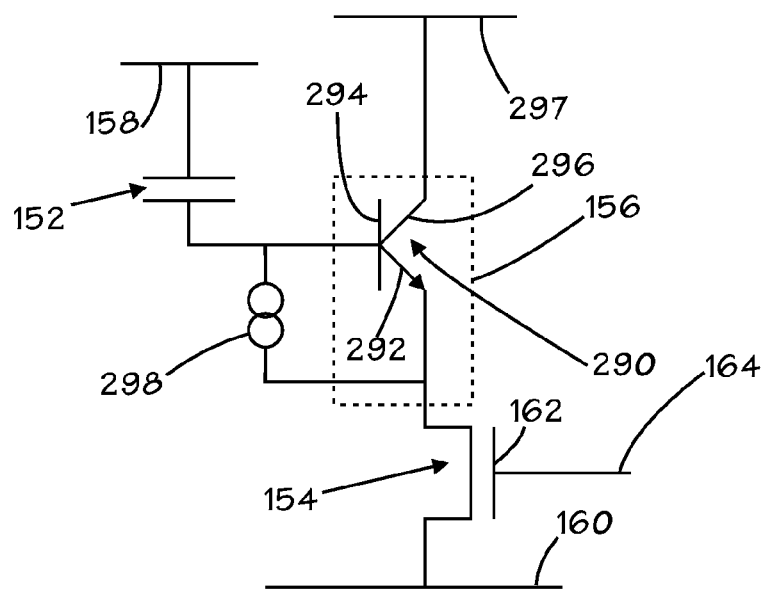
FIG. 10 is a schematic view of an exemplary embodiment of a memory cell in accordance with the present invention.

With the aforementioned charging schemes in hand, it may be instructive to again consider a schematic representation of the memory cell 150, such as that presented in FIG. 10. As described elsewhere herein, the cell 150 includes a capacitor 152, an access transistor 154, and an amplifier 156. The amplifier 156 amplifies the charge stored in the capacitor 152. One plate of the capacitor 152 is coupled to the amplifier 156 and the other plate is coupled to a common line 158. The amplified charge is delivered to a bit line 160 through the access transistor 154. The access transistor 154 includes a gate 162. The switching action of the transistor 154 is controlled by the gate 162. The gate 162 may be connected to a word line 164. The amplifier 156 is implemented as a BJT 290. The emitter 292 of the BJT 290 is connected to the access transistor 154. The base 294 of the BJT is connected to the capacitor 152. The collector 296 of the BJT is coupled to a conductor 297 capable of biasing the collector 296. The schematic diagram also includes a charger 298 symbolically showing the above-described charging mechanisms for charging capacitor 152 (GIDL or impact ionization).

Figure 11:
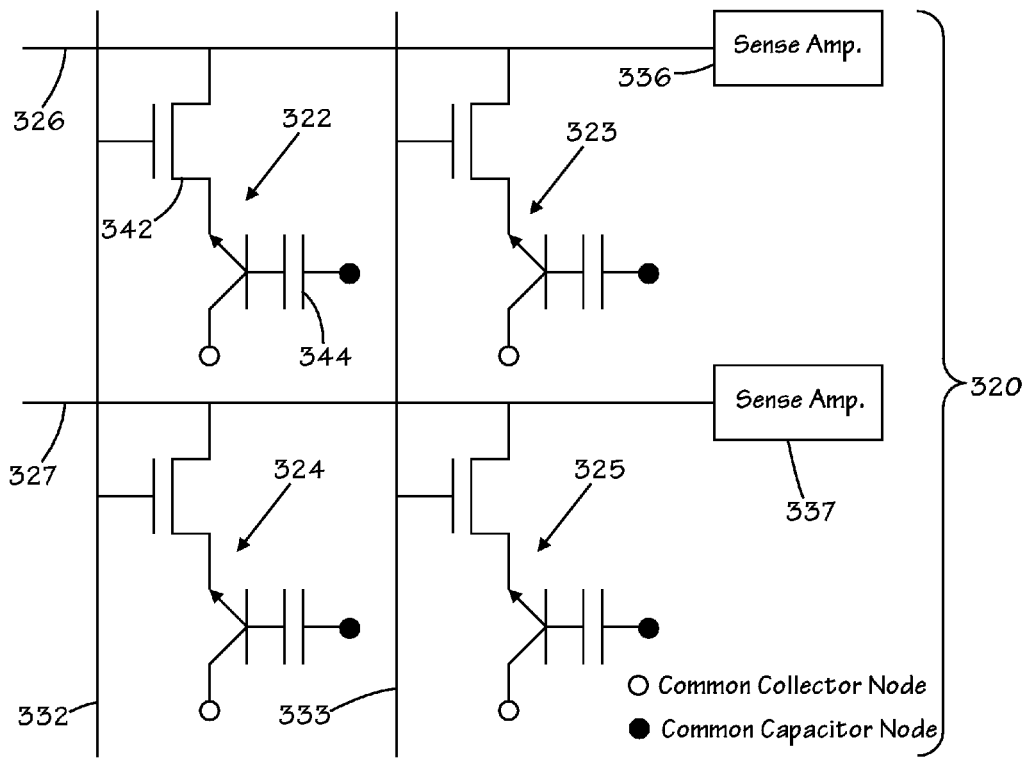
FIG. 11 is a schematic view of an exemplary embodiment of a memory array in accordance with the present invention.

The memory cell of the present invention can be assembled into a memory array. FIG. 11 is a schematic diagram of a memory array 320 of the present invention. The memory array 320 is designed to use the first method of charging. It includes a plurality of memory cells, such as cells 322-325, connected using bit lines, such as bit lines 326-327, and word lines, such as word lines 332-333. Bit lines 326 and 327 are connected to sense amplifiers 336 and 337, respectively. The structure of each memory cell is substantially the same. For example, memory cell 322 has an access transistor 342 and a virtual capacitor 344. In this arrangement, the bit line is connected to the drain of the access transistor. The bias condition for the capacitor gate is common to all capacitor gates. The collector bias condition is also common to all collectors.

Figure 12:
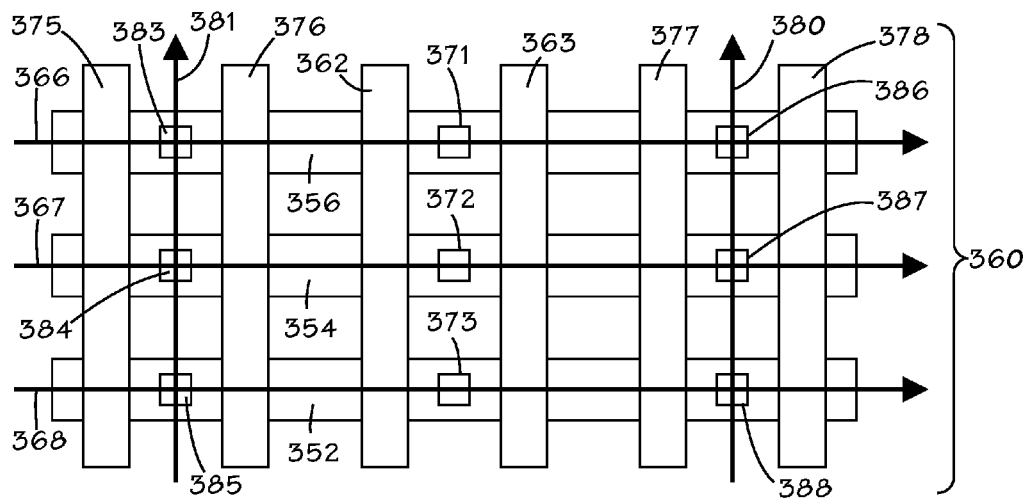
FIG. 12 is a layout view of an exemplary embodiment of a memory array in accordance with the present invention.

FIG. 12 shows a layout of an embodiment of a memory array 350 that is designed to use the first method of charging. It should be understood that FIG. 12 is essentially an overhead view. Accordingly, semiconductor regions 352, 354 and 356 not unlike the semiconductor layer 205 shown in section in FIG. 4 are visible. The semiconductor regions 352, 354 and 356 are where the various impurity regions that make up the devices, such as the collectors, bases, drains, etc. are positioned. The memory array 350 additionally includes two word lines 362 and 363 and three bit lines 366, 367 and 368. Note that the bit lines 366, 367 and 368 are shown schematically for simplicity of illustration. There are three bit line contacts 371, 372 and 373. Each of the three bit line contacts 371, 372 and 373 is shared with adjacent word lines 362 and 363. Four capacitor gate lines 375, 376, 377 and 378 and two collector lines 380 and 381 are also provided. Like the bit lines 366, 367 and 368, the collector lines 380 and 381 are represented schematically for simplicity of illustration. The capacitor gate lines 375, 376, 377 and 378 and the collector lines 380 and 381 are parallel with word lines 362 and 363. Each of the collector contacts 383-388 is shared with two adjacent capacitors gates. Note that no isolation structure is needed in the bit line direction.

Figure 13:
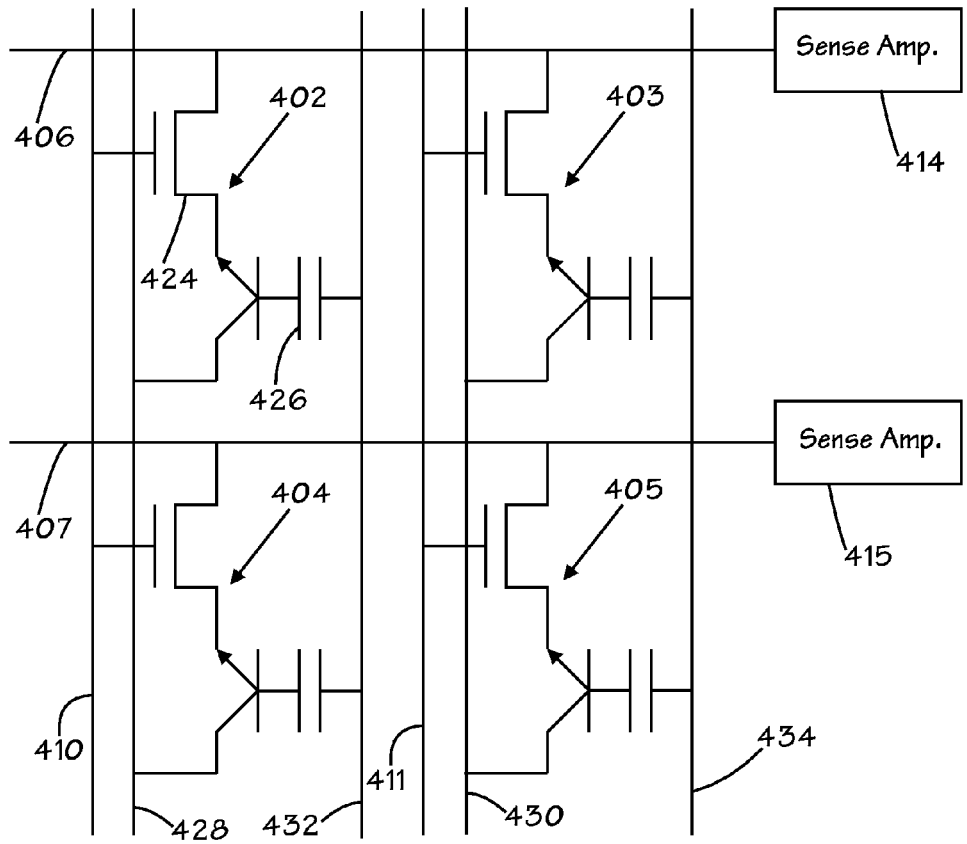
FIG. 13 is a schematic view of an alternate exemplary embodiment of a memory array in accordance with the present invention.

Another way to assemble the memory cells will now be described in conjunction with FIG. 13, which is a schematic view of an exemplary embodiment of a memory array 400. The memory array 400 is designed to use the second method of charging described herein. The array 400 includes a plurality of memory cells, such as cells 402, 403, 404 and 405, connected using bits lines, such as bit lines 406 and 407, and word lines, such as word lines 410, 411 and 412. The bit lines 406 and 407 are connected to sense amplifiers 414 and 415, respectively. The structure of each memory cell is substantially the same. For example, the memory cell 402 has an access transistor 424 and a virtual capacitor 426. The memory array 400 also has collector lines 428 and 430 and capacitor gate lines 432 and 434. In this embodiment, both capacitor gate lines and collector lines are common in the word line direction but separated between two adjacent cells in the bit line direction.

Figure 14:
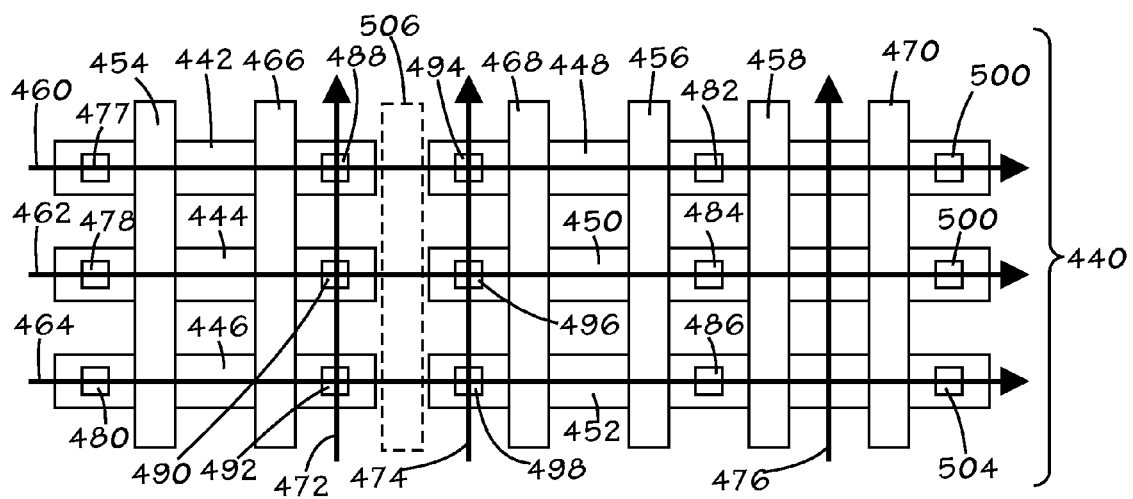
FIG. 14 is a layout view of an alternate exemplary embodiment of a memory array in accordance with the present invention.

FIG. 14 is a layout diagram of an exemplary embodiment of a memory array 440 of the present invention that is designed to use the second method of charging described herein. Again, it should be understood that FIG. 14 is essentially an overhead view. Accordingly, semiconductor regions 442, 444, 446, 448, 450 and 452 not unlike the semiconductor layer 205 shown in section in FIG. 4 are visible. The semiconductor regions 442, 444, 446, 448, 450 and 452 are where the various impurity regions that make up the devices of the array 440, such as the collectors, bases, drains, etc. are positioned. The array 440 includes three word lines 454, 456 and 458, three bit lines 460, 462 and 464, three capacitor gate lines 466, 468 and 470, and three collector lines 472, 474 and 476. FIG. 14 also shows six bit line contacts 476, 478, 480, 482, 484 and 486, and nine collector line contacts 488, 490, 492, 494, 496, 498, 500, 502 and 504. Note that a collector contact is not shared with two adjacent capacitor gates, unlike the arrangement in FIG. 12. Therefore isolation structures, as represented by the dashed box 506, are needed in the bit line direction.

Figure 15:
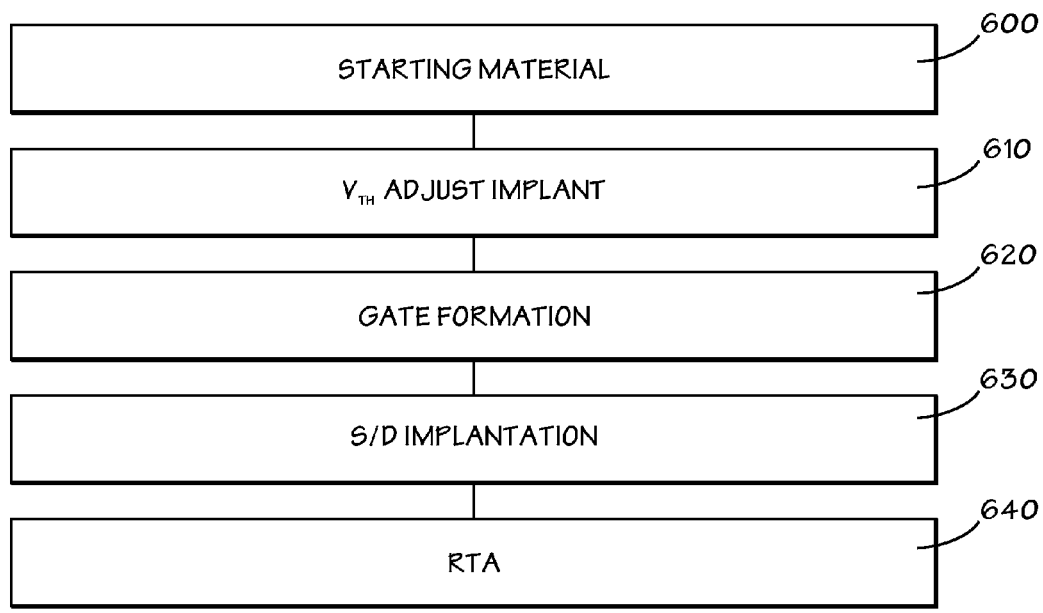
FIG. 15 is a schematic process flow diagram of a conventional method of fabricating a memory cell.

FIG. 15 is a schematic process flow diagram of a conventional method of fabricating a memory cell using a CMOS process. At step 600, a starting material consisting of a SOI wafer with silicon layer thickness of preferably between 10 nm to 100 nm is provided. At step 610, a threshold voltage $V_{th}$ adjust implant is performed. At step 620, gate formation is performed. At step 630, source/drain implant or implants are performed. At step 640, a rapid thermal anneal (RTA) is performed to activate the implanted impurities.

Figure 16:
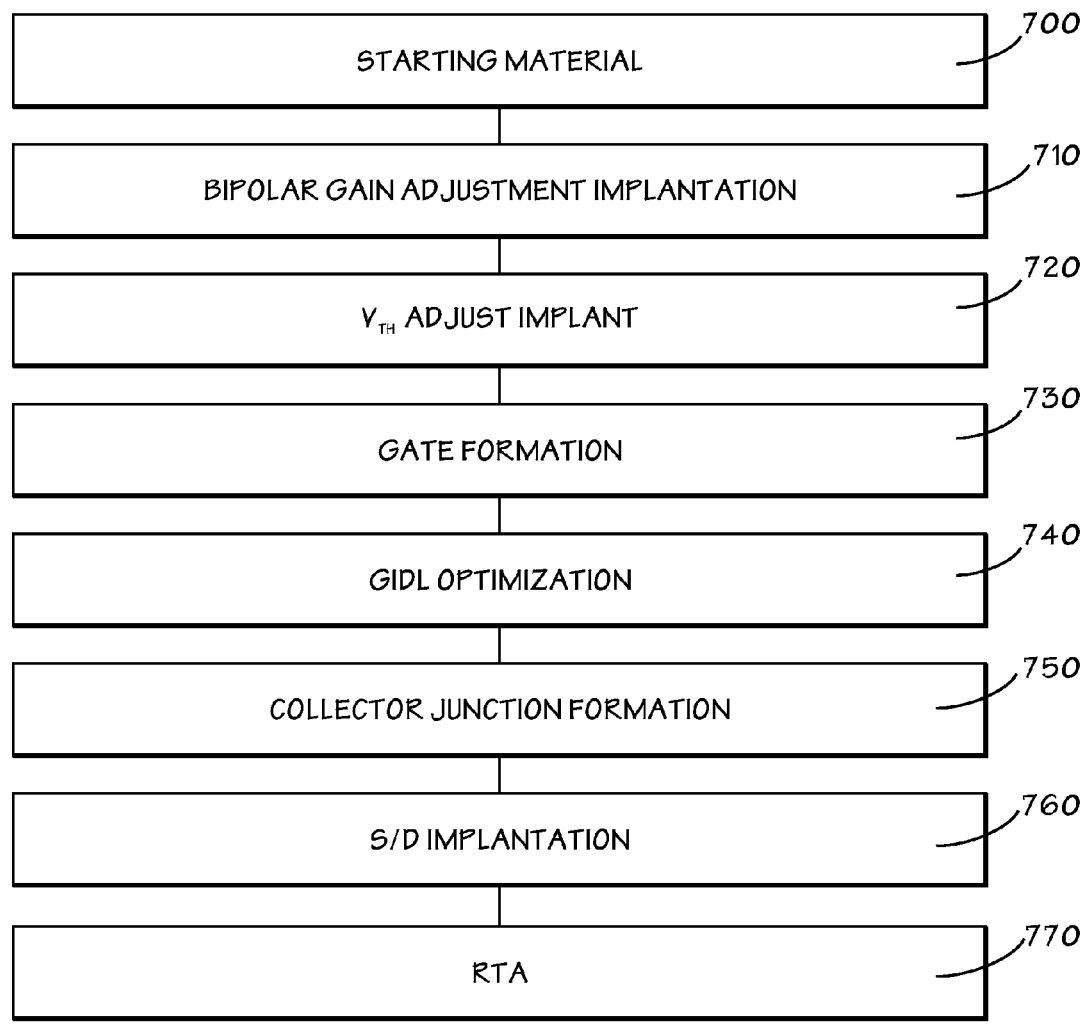
FIG. 16 is a schematic process flow diagram of an exemplary method of fabricating a memory cell in accordance with the present invention.

FIG. 16 is a schematic process flow diagram of an exemplary method of fabricating a memory cell using a CMOS process in accordance with the present invention. Some of the process steps are the same as those described in conjunction with FIG. 15. Others are added. At step 700, a starting material consisting of a SOI wafer with silicon layer thickness of preferably between 10 nm to 100 nm is provided. At step 710, a bipolar gain adjustment implant is performed. At step 720, a threshold voltage $V_{th}$ adjust implant is performed. At step 730, gate formation is performed. At step 740, an additional implant after gate oxidation and gate poly definition is used to optimize the GIDL current. A special N-type implantation is applied to the emitter side of the bipolar junction. This pushes the junction boundary further underneath the capacitor gate. Note that this step is not needed if impact ionization (instead of GIDL) is used for charging. At step 750, collector junction implantation is performed after GIDL optimization (or gate etching for the case of impact ionization) and before optional spacer formation processing. Depending on the cell types, various implantation angles and energy can be chosen. At step 760, source/drain implant or implants are performed. At step 770, a rapid thermal anneal (RTA) is performed to activate the implanted impurities.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of forming a memory cell, comprising:
   forming a MOS transistor having a gate, a source region and a drain region;
   forming a bipolar transistor having a collector, a base and an emitter; and
   wherein forming of the emitter of the bipolar transistor includes forming the emitter of bipolar transistor to serve as the source region for the MOS transistor and the forming of the base of the bipolar transistor includes forming the base of the bipolar transistor to serve as a capacitive charge storage region for the memory cell.

2. The method of claim 1, comprising forming a capacitor gate proximate and operable to capacitively couple to the base.

3. The method of claim 1, comprising forming a word line coupled to the gate of the MOS transistor and a bit line coupled to the drain of the MOS transistor.

4. The method of claim 1, wherein the forming of the base of the bipolar transistor comprises forming a p-type impurity region and the forming of the source of the MOS transistor comprises forming an n-type impurity region.

5. The method of claim 1, wherein the forming of the memory cell comprises forming the MOS transistor and the bipolar transistor on a semiconductor-on-insulator substrate.

6. The method of claim 1, comprising coupling a sense amplifier to the drain of the MOS transistor.

7. A memory cell, comprising:
   a MOS transistor having a gate, a source region and a drain region;
   a bipolar transistor having a collector, a base and an emitter; and
   wherein the emitter of the bipolar transistor serves as the source region for the MOS transistor and the base of the bipolar transistor serves as a capacitive charge storage region for the memory cell.

8. The memory cell of claim 7, comprising a capacitor gate positioned proximate and being operable to capacitively couple to the base.

9. The memory cell of claim 7, comprising a word line coupled to the gate of the MOS transistor and a bit line coupled to the drain of the MOS transistor.

10. The memory cell of claim 7, wherein the base of the bipolar transistor comprises a p-type impurity region and the source comprises an n-type impurity region.

11. The memory cell of claim 7, wherein the MOS transistor and the bipolar transistor are formed on a semiconductor-on-insulator substrate.

12. The memory cell of claim 7, comprising a sense amplifier coupled to the drain of the MOS transistor.

13. A memory array, comprising:
   a plurality of memory cells, each of the memory cells including a MOS transistor having a gate, a source region and a drain region, and a bipolar transistor having a collector, a base and an emitter, wherein the emitter of the bipolar transistor serves as the source region for the MOS transistor and the base of the bipolar transistor serves as a capacitive charge storage region for the memory cell;
   a word line coupled to the gate of each MOS transistor; and
   a bit line coupled to the drain region of each MOS transistor.

14. The memory array of claim 13, comprising a capacitor gate positioned proximate and being operable to capacitively couple to the base of each bipolar transistor.

15. The memory array of claim 13, wherein the base of each bipolar transistor comprises a p-type impurity region and the source of each MOS transistor comprises an n-type impurity region.

16. The memory array of claim 13, wherein the plurality of MOS transistors and bipolar transistor are formed on a semiconductor-on-insulator substrate.

17. The memory array of claim 13, comprising a sense amplifier coupled to the drain of each MOS transistor.

* * * * *